United States Patent
Choi (10) Patent No.: US 7,989,850 B2
(45) Date of Patent: Aug. 2, 2011

(54) ARRAY SUBSTRATE AND METHOD OF FABRICATING THE SAME

(75) Inventor: Hee-Dong Choi, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 113 days.

(21) Appl. No.: 12/591,795

(22) Filed: Dec. 1, 2009

(65) Prior Publication Data

US 2011/0017999 A1 Jan. 27, 2011

(30) Foreign Application Priority Data

Jul. 24, 2009 (KR) .................. 10-2009-0067743

(51) Int. Cl.
| | |
|---|---|
| H01L 29/04 | (2006.01) |
| H01L 29/10 | (2006.01) |
| H01L 31/00 | (2006.01) |
| H01L 27/14 | (2006.01) |
| H01L 29/15 | (2006.01) |
| H01L 31/036 | (2006.01) |
| H01L 29/18 | (2006.01) |
| H01L 33/00 | (2006.01) |
| H01L 27/118 | (2006.01) |
| H01L 23/52 | (2006.01) |
| H01L 29/66 | (2006.01) |
| H01L 29/78 | (2006.01) |
| H01L 21/70 | (2006.01) |
| H01L 27/088 | (2006.01) |
| H01L 27/082 | (2006.01) |
| H01L 27/105 | (2006.01) |
| H01L 27/12 | (2006.01) |

(52) U.S. Cl. .............. 257/211; 257/59; 257/72; 257/88; 257/204; 257/365; 257/366; 257/412; 257/524; 257/E33.003; 257/E33.004; 257/E33.053; 257/E27.06; 257/E27.081; 257/E27.111

(58) Field of Classification Search .............. 257/59, 257/88, 204, E33.003, E33.004, E33.053, 257/E27.06, E27.081, 412, 211, 365, 366, 257/353–354, 524, 52–72, E27.111; 349/33–54, 349/139–152

See application file for complete search history.

(56) References Cited

U.S. PATENT DOCUMENTS

2008/0002125 A1* 1/2008 Kim .............................. 349/140

FOREIGN PATENT DOCUMENTS

| KR | 10-2003-0015618 A | 2/2003 |
|---|---|---|
| KR | 10-2005-0003249 A | 1/2005 |
| KR | 10-2008-0053698 A | 6/2008 |
| KR | 10-2008-0059827 A | 7/2008 |

* cited by examiner

*Primary Examiner* — Phat Cao
*Assistant Examiner* — Diana Vieira
(74) *Attorney, Agent, or Firm* — Mckenna Long & Aldridge LLP

(57) ABSTRACT

An array substrate includes first and second gate electrodes on a substrate; a gate insulating layer on the first and second gate electrodes; first and second active layers on the gate insulating layer; an interlayer insulating layer on the first and second active layers; first to fourth ohmic contact layers respectively contacting both sides of the first active layer and both sides of the second active layer; first and second source electrodes and first and second drain electrodes respectively on the first, third, second and fourth ohmic contact layers; a data line connected to the first source electrode; a first passivation layer connected to the first gate electrode; a power line; one end and the other end of a connection electrode respectively connected to the first drain electrode and the second gate electrode; a second passivation layer; and a pixel electrode-connected to the second drain electrode.

17 Claims, 6 Drawing Sheets

FIG. 1
RELATED ART

FIG. 2
RELATED ART
dry-etching

ARRAY SUBSTRATE AND METHOD OF FABRICATING THE SAME

The present application claims the benefit of Korean Patent Application No. 10-2009-0067743 filed in Korea on Jul. 24, 2009, which is hereby incorporated by reference.

BACKGROUND OF THE INVENTION

1. Field of the Invention

The present invention relates to an array substrate and more particularly to an array substrate being capable of preventing damages on an active layer, and having an excellent property and high aperture ratio and a method of fabricating the array substrate.

2. Discussion of the Related Art

As the society has entered in earnest upon an information age, flat panel display devices, which have excellent capabilities of a thin profile, light weight and low power consumption, and so on, are introduced.

Among these devices, an active matrix type liquid crystal display (LCD) device is widely used for notebook computers, monitors, TV, and so on instead of a cathode ray tube (CRT), because of their high contrast ratio and characteristics adequate to display moving images.

On the other hand, an organic electroluminescent display (OELD) device is also widely used because their high brightness and low driving voltage. In addition, since the OELD device is a self-emission type, the OELD device produces high contrast ratio, a thin profile and a fast response time.

Both the LCD device and the OELD device require an array substrate where a thin film transistor (TFT) as a switching element in each pixel for controlling the pixel to be turned on and off. The OELD device additionally requires a driving TFT for driving an organic electroluminescent diode.

Figure 1:
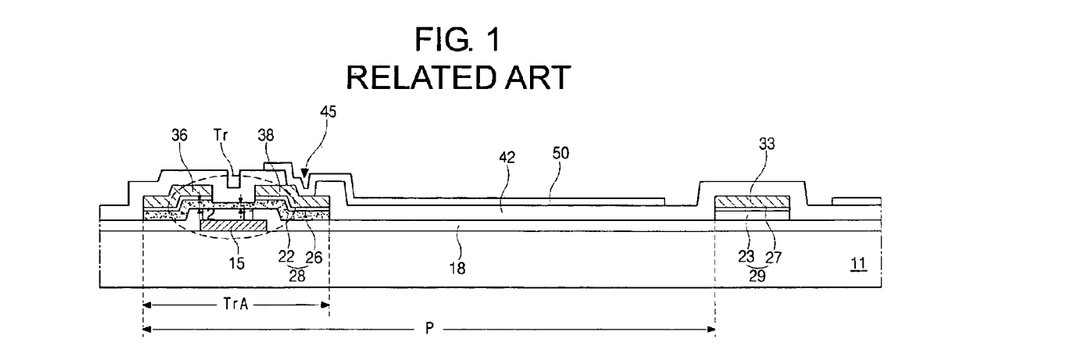
FIG. 1 is a cross-sectional view showing one pixel region of the related art array substrate.

FIG. 1 is a cross-sectional view showing one pixel region of the related art array substrate. In FIG. 1, a gate electrode 15 is formed on a substrate 11 and in a driving region TrA, where a driving TFT Tr will be formed, inside a pixel region P. A gate line (not shown) connected to the gate electrode 15 is formed along a first direction. A gate insulating layer 18 is formed on the gate electrode 15 and the gate line. A semiconductor layer 28 including an active layer 22 of intrinsic amorphous silicon and an ohmic contact layer 26 of impurity-doped amorphous silicon is formed on the gate insulating layer 18 and in the driving region TrA. A source electrode 36 and a drain electrode 38 are formed on the semiconductor layer 28 and in the driving region TrA. The source electrode 36 is spaced apart from the drain electrode 38. A data line 33 connected to the source electrode 36 is formed along a second direction. The data line 33 crosses the gate line to define a pixel region P. The gate electrode 15, the gate insulating layer 18, the semiconductor layer 28, the source electrode 36 and the drain electrode 38 constitute the driving TFT Tr.

Although not shown, a switching TFT having substantially the same structure as the driving TFT Tr is formed in the pixel region P. The switching TFT is connected to the driving TFT Tr, the gate line and the data line 33.

A passivation layer 42 including a drain contact hole 45 is formed to cover the driving TFT Tr. On the passivation layer 42, a pixel electrode 50 connected to the drain electrode 38 through the drain contact hole 45 is formed. In FIG. 1, first and second patterns 27 and 23, which are respectively formed of the same material as the ohmic contact layer 26 and the active layer 22, are formed under the data line 33.

In the semiconductor layer 28 of the TFT Tr, the active layer 22 of intrinsic amorphous silicon has a difference in a thickness. Namely, the active layer 22 has a first thickness t1 at a central portion and a second thickness t2 at side portions. The first thickness t1 is different from the second thickness t2. Properties of the TFT Tr are degraded by the thickness difference in the active layer 22. The thickness difference in the active layer 22 results from a fabricating process explained with reference to FIG. 2.

Figure 2:
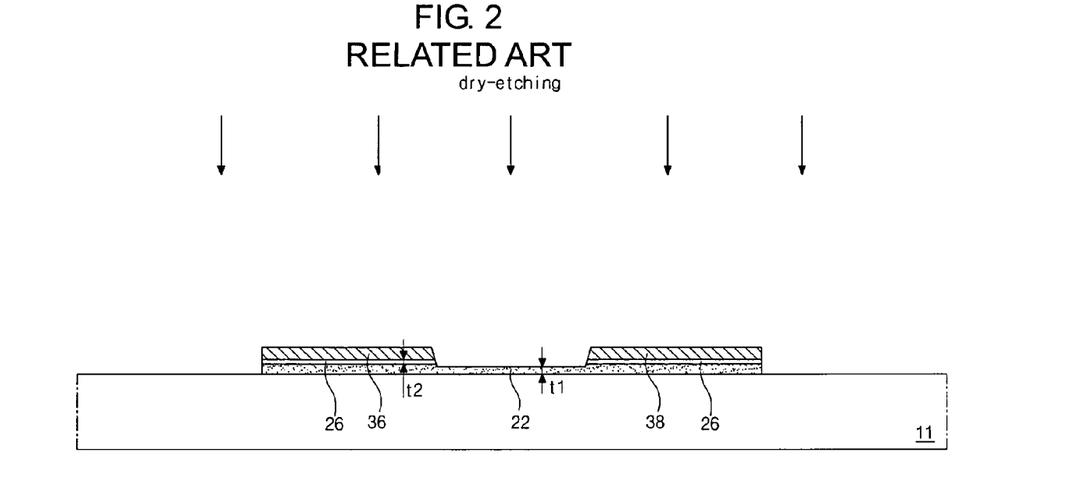
FIG. 2 is a cross-sectional view illustrating a fabricating process of a semiconductor layer and source and drain electrode of the related art array substrate.

FIG. 2 is a cross-sectional view illustrating a fabricating process of a semiconductor layer and source and drain electrode of the related art array substrate. For convenience of explanation, the gate electrode and the gate insulating layer under the active layer is not shown.

In FIG. 2, an intrinsic amorphous silicon layer (not shown), an impurity-doped amorphous silicon layer (not shown) and a metal layer (not shown) are sequentially formed on the substrate 11. Then, the metal layer, the impurity-doped amorphous silicon and the intrinsic amorphous silicon layer are patterned to form a metal pattern (not shown), an impurity-doped amorphous pattern (not shown) and an intrinsic amorphous silicon pattern (not shown).

Next, a center of the metal pattern is etched to form the source and drain electrodes 36 and 38 spaced apart from each other. As a result, a center of the impurity-doped amorphous silicon pattern is exposed through the source and drain electrodes 36 and 38.

A dry-etching process is performed onto the impurity-doped amorphous silicon pattern to removed the exposed impurity-doped amorphous silicon pattern using the source and drain electrodes 36 and 38 as an etching mask. As a result, the ohmic contact layer 26 is formed under the source and drain electrodes 36.

In this case, the dry-etching process is performed for a relative long time to completely remove the under the impurity-doped amorphous silicon pattern exposed through a space between the source and drain electrodes. As a result, a central portion of the active layer 22 under the removed impurity-doped amorphous silicon pattern is partially removed by the dry-etching process such that the active layer 22 has a difference in a thickness. (t1≠t2) If the dry-etching process is not performed for an enough long time, the impurity-doped amorphous silicon pattern partially remains on the active layer 22 such that properties of the TFT Tr (of FIG. 1) are seriously degraded. The thickness difference in the active layer 22 is an inevitable result of the above fabricating process for the array substrate.

In addition, since the active layer 22 is partially removed during the dry-etching process, the intrinsic amorphous silicon layer 20 for the active layer 22 should be formed to have an enough thickness above 1000 angstroms such that there are disadvantages in production costs and a fabricating time.

The TFT Tr is very important element for the array substrate. The TFT Tr is positioned in each pixel region and connected to the gate and data line such that a signal is selectively provided the pixel electrode in each pixel region through the TFT Tr. Unfortunately, since the active layer of the TFT Tr is formed of intrinsic amorphous silicon, there are some problems. For example, when light is irradiated onto the active layer or an electric field is applied to the active layer, the active layer is changed to be a metastable state such that there is a problem of a security of the TFT Tr. In addition, since mobility of carriers in a channel of the active layer is relatively low, the TFT Tr including the active layer of intrinsic amorphous silicon is not adequate to a driving element for the OELD device.

Figure 3:
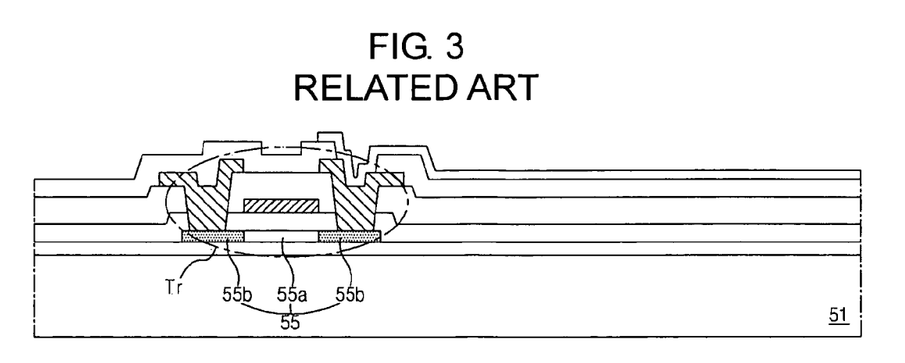
FIG. 3 is a cross-sectional view showing a TFT including a semiconductor layer of polycrystalline silicon for the related art array substrate.

To resolve these problems, the TFT including an active layer of polycrystalline silicon, which is crystallized from intrinsic amorphous silicon by a crystallization process using a laser beam, is introduced. However, referring to FIG. 3, which is a cross-sectional view showing a TFT Tr including a semiconductor layer 55 of polycrystalline silicon for the related art array substrate, the semiconductor layer 55 includes a first region 55a and a second region 55b at both sides of the first region 55a. High concentration impurities should be doped into the second region 55b of the semiconductor layer 55. Accordingly, a doping process for the second region 55b and an implant apparatus for the doping process are required such that production costs are seriously increased. In addition, new process line is required.

SUMMARY OF THE INVENTION

Accordingly, the present invention is directed to an array substrate and a method of fabricating the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate includes a substrate including a switching region and a driving region; first and second gate electrodes positioned on the substrate and in the switching region and the display region, respectively; a gate insulating layer on the first and second gate electrodes and including a first gate contact hole exposing a portion of the first gate electrode and a second gate contact hole exposing a portion of the second gate electrode; first and second active layers on the gate insulating layer and corresponding to the first and second gate electrodes, respectively; an interlayer insulating layer on the first and second active layers, the interlayer insulating layer including first to fourth active contact holes and the first and second gate contact holes, the first and second active contact holes respectively exposing both sides of the first active layer, the third and fourth active contact holes respectively exposing both sides of the second active layer; first and second ohmic contact layers respectively contacting both sides of the first active layer through the first and second active contact holes; third and fourth ohmic contact layers respectively contacting both sides of the second active layer through the third and fourth active contact holes; first source electrode and first drain electrode respectively on the first and second ohmic contact layers; second source electrode and second drain electrode respectively on the third and fourth ohmic contact layers; a data line on the interlayer insulating layer and connected to the first source electrode; a first passivation layer on the data line, the first and second source electrodes and the first and second drain electrodes and including the first and second gate contact holes, a first drain contact hole exposing a portion of the first drain electrode and a second drain contact hole exposing a portion of the second drain electrode; a gate line on the first passivation layer and connected to the first gate contact hole through the first gate contact hole, the gate line crossing the data line; a power line on the first passivation layer and parallel to and spaced apart from the gate line; a connection electrode on the first passivation layer, one end of the connection electrode connected to the first drain electrode through the first drain contact hole, the other end of the connection electrode connected to the second gate electrode through the second gate contact hole; a second passivation layer on the gate line, the power line and the connection electrode and including the second drain contact hole; and a pixel electrode on the second passivation layer and connected to the second drain electrode through the second drain contact hole.

In another aspect, a method of fabricating an array substrate includes forming first and second gate electrodes on a substrate including a switching region and a driving region, a gate insulating layer on the first and second gate electrodes, and first and second active layers on the gate insulating layer and corresponding to the first and second gate electrodes, respectively, the first and second gate electrodes respectively positioned in the switching and driving regions; forming an interlayer insulating layer on the first and second active layers and including first to fourth active contact holes, the first and second active contact holes respectively exposing both sides of the first active layer, the third and fourth active contact holes respectively exposing both sides of the second active layer; forming first to fourth ohmic contact layers, first and second source electrodes, first and second drain electrodes and a data line on the interlayer insulating layer, the first and second ohmic contact layers respectively contacting both sides of the first active layer through the first and second active contact holes, the third and fourth ohmic contact layers respectively contacting both sides of the second active layer through the third and fourth active contact holes, the first source electrode and the first drain electrode respectively on the first and second ohmic contact layers, the second source electrode and the second drain electrode respectively on the third and fourth ohmic contact layers, the data line connected to the first source electrode; forming a first passivation layer on the data line, the first and second source electrodes and the first and second drain electrodes and including first and second gate contact holes respectively exposing the first and second gate electrodes and a first drain contact hole exposing the first drain electrode; forming a gate line, a power line and a connection electrode on the first passivation layer, the gate line connected to the first gate contact hole through the first gate contact hole and crossing the data line, the power line parallel to and spaced apart from the gate line, one end of the connection electrode connected to the first drain electrode through the first drain contact hole, the other end of the connection electrode connected to the second gate electrode through the second gate contact hole; forming a second passivation layer on the gate line, the power line and the connection electrode and including a second drain contact hole exposing the second drain electrode; and forming a pixel electrode on the second passivation layer and connected to the second drain electrode through the second drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 4:
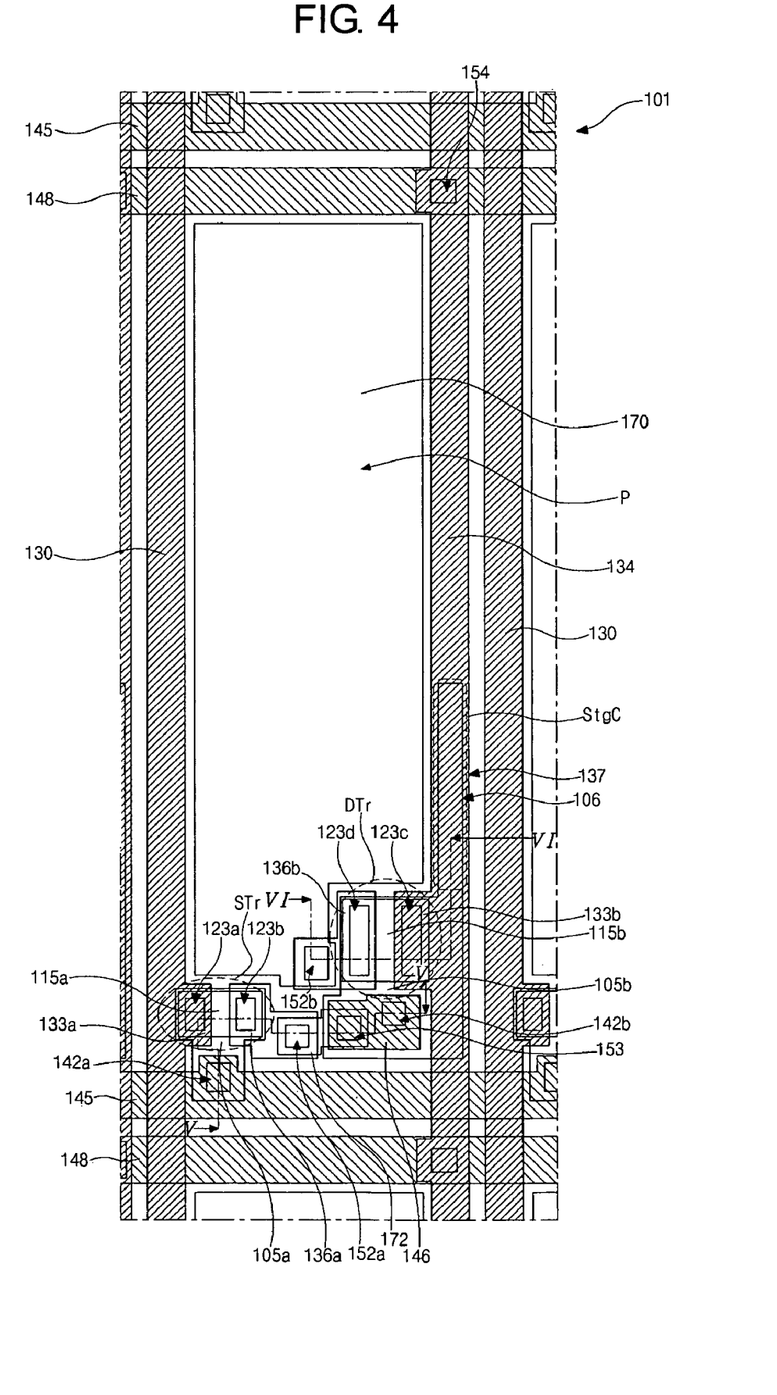
FIG. 4 is a plan view of one pixel region of an array substrate for an OELD device according to a first embodiment of the present invention.

FIG. 4 is a plan view of one pixel region of an array substrate for an OELD device according to a first embodiment of the present invention.

In FIG. 4, a gate line 145 and a data line 130 are formed on a substrate 101. The gate and data lines 145 and 130 cross each other to define a pixel region P. A power line 148 is formed to be spaced apart from and parallel to the gate line 145. A power electrode 134 connected to the power line 148 through a power contact hole 154 is formed to be spaced apart from and parallel to the data line 130.

A switching thin film transistor (TFT) STr is formed in the pixel region P. A first gate electrode 105a of the switching TFT STr is connected to the gate line 145 through a first gate contact hole 142a, a first source electrode 133a of the switching TFT STr extends from the data line 130. A driving TFT DTr connected to the switching TFT STr is also formed. A gate auxiliary pattern 146 contacting a second gate electrode 105b of the driving TFT DTr through a second gate contact hole 142b, which exposes the second gate electrode 105b of the driving TFT DTr, is formed. A gate connection electrode 172 contacts a first drain electrode 136a of the switching TFT STr through a first drain contact hole 152a and the gate auxiliary pattern 146 through an auxiliary pattern contact hole 153. Since the gate auxiliary pattern 146 contacts the second gate electrode 105b, the first drain electrode 136a of the switching TFT STr is electrically connected to the second gate electrode 105b via the auxiliary pattern 146 and the gate connection electrode 172.

A pixel electrode 170, which is connected to a second drain electrode 136b of the driving TFT DTr through a second drain contact hole 152b, is formed in the pixel region P. A second source electrode 133b of the driving TFT DTr extends from the power electrode 134. In addition, a portion of the power electrode 134 overlaps a portion of the second gate electrode 105b with a gate insulating layer (not shown) and an interlayer insulating layer (not shown) interposed therebetween. The overlapped portion of the second gate electrode 105b serves as a first storage electrode 106, the overlapped portion of the power electrode 134 serves as a second storage electrode 137, and the gate insulating layer and the interlayer insulating layer serve as a dielectric material layer. The first storage electrode 106, the second storage electrode 137 and the dielectric material layer constitute a storage capacitor StgC.

As shown in FIG. 4, the array substrate according to the first embodiment of the present invention requires ten contact holes in each pixel region P. First to fourth active contact holes 123a, 123b, 123c and 123d are required for respectively connecting the first source electrode 133a and the first drain electrode 136a to a first active layer 115a and the second source electrode 133b and the second drain electrode 136b to a second active layer 115b. The first gate contact hole 142a is required for connecting the first gate electrode 105a to the gate line 145. The second gate contact hole 142b exposing the second gate electrode 105b, the first drain contact hole 152a exposing the first drain electrode 136a and an auxiliary pattern contact hole 153 exposing the gate auxiliary pattern 146 are required for connecting the first drain electrode 136a of the switching TFT STr to the second gate electrode 105b of the driving TFT DTr. The second drain contact hole 152b is required for connecting the pixel electrode 170 to the second drain electrode 136b. In addition, the power contact hole 154 is required for connecting the power electrode 134 to the power line 148.

Figure 5:
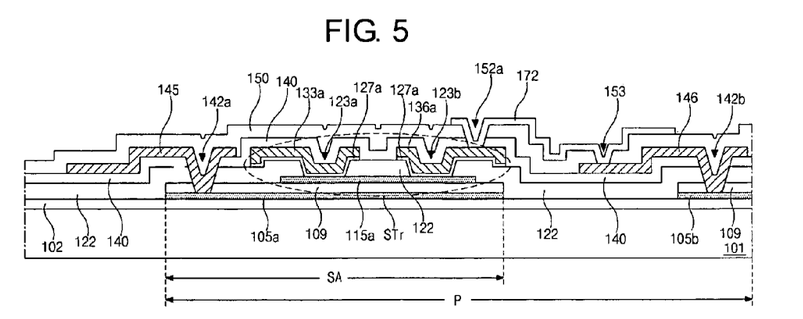
FIG. 5 is a cross-sectional view taken along the line V-V of FIG. 4.
Figure 6:
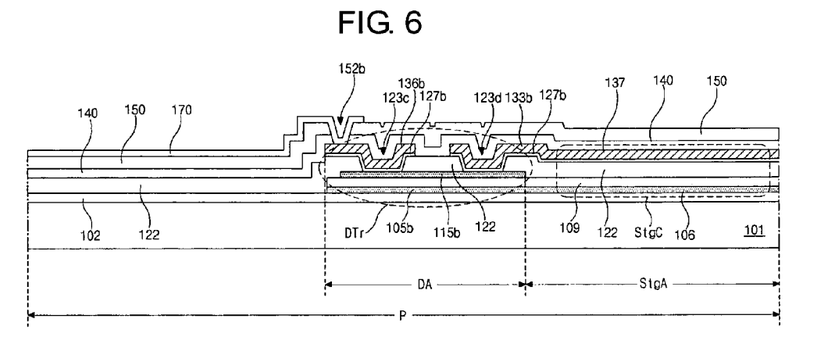
FIG. 6 is a cross-sectional view taken along the line VI-VI of FIG. 4.

The array substrate according to the first embodiment of the present invention is explained in more detail with reference to FIGS. 5 and 6. FIG. 5 is a cross-sectional view taken along the line V-V of FIG. 4, and FIG. 6 is a cross-sectional view taken along the line VI-VI of FIG. 4. A switching region SA, where the switching TFT STr is formed, a driving region DA, where the driving TFT DTr is formed, and a storage region StgA, where the storage capacitor StgC is formed, are defined in the pixel region P.

In FIGS. 5 and 6, a buffer layer 102, which is made of an inorganic insulating material, is formed on the substrate 101. The first gate electrode 105a and the second gate electrode 105b are respectively formed on the buffer layer 102 and in the switching and driving regions SA and DA. Each of the first and second gate electrodes 105a and 105b is formed of impurity-doped polycrystalline silicon. The second gate electrode 105b extends into the storage region StgA such that the first storage electrode 106 is formed in the storage region StgA.

The gate insulating layer 109 is formed to cover the first and second gate electrodes 105a and 105b and the first storage electrode 106. The gate insulating layer 109 is formed of an inorganic insulating material. The first and second active layers 115a and 115b are formed on the gate insulating layer 109 and respectively disposed in the switching and driving regions SA and DA. Each of the first and second active layers 115a and 115b is formed of intrinsic polycrystalline silicon. The first and second active layers 115a and 115b respectively correspond to the first and second gate electrodes 105a and 105b. At least one side portion of the gate insulating layer 109 is exposed. Namely, the at least one side portion of the gate insulating layer 109 is not covered with the first and second active layers 115a and 115b.

The interlayer insulating layer 122 including the first to fourth active contact holes 123a to 123d is formed on the first and second active layers 115a and 115b. The first and second active contact holes 123a and 123b respectively expose both sides of the first active layer 115a, and the third and fourth active contact holes 123c and 123d respectively expose both sides of the second active layer 115b.

On the interlayer insulating layer 122, first ohmic contact layers 127a contacting the first active layer 115a through the first and second active contact holes 123a and 123b is formed in the switching region SA. The first source electrode 133a is formed on one of the first ohmic contact layers 127a, and the first drain electrode 136a is formed on the other one of the first ohmic contact layers 127a. The one of the first ohmic contact layers 127a and the first source electrode 133a are spaced apart from the other one of the first ohmic contact layers 127a and the first drain electrode 136a, respectively.

On the interlayer insulating layer 122, second ohmic contact layers 127b contacting the second active layer 115b through the third and fourth active contact holes 123c and 123d is formed in the driving region DA. The second source electrode 133b is formed on one of the second ohmic contact layers 127b, and the second drain electrode 136b is formed on the other one of the second ohmic contact layers 127b. The one of the second ohmic contact layers 127b and the second source electrode 133b are spaced apart from the other one of the second ohmic contact layers 127b and the second drain electrode 136b, respectively. The second source electrode 133b extends into the storage region StgA such that the second storage electrode 137 is formed in the storage region StgA. The second source electrode 133b further extends to form the power electrode 134 (of FIG. 4).

In addition, the data line 130 (of FIG. 4) is formed on the interlayer insulating layer 122 and connected to the first source electrode 133a.

A first passivation layer 140 of an inorganic insulating material is formed on the first and second source electrodes 133a and 133b, the first and second drain electrodes 136a and 136b, the second storage electrode 137, the power electrode 134 and the data line 130. The first passivation layer 140, the interlayer insulating layer 122 and the gate insulating layer 109 are patterned to form the first and second gate contact holes 142a and 142b respectively exposing the first and second gate electrodes 105a and 105b. In addition, the first passivation layer 140 is patterned to form the power contact hole 154 (of FIG. 4) exposing the power electrode 134.

The gate line 145, the gate auxiliary pattern 146 and the power line 148 (of FIG. 4) are formed on the first passivation layer 140. The gate line 145 is connected to the first gate electrode 105a through the first gate contact hole 142a and cross the data line 130 to define the pixel region P. The gate auxiliary pattern 146 contacts and is connected to the second gate electrode 105b through the second gate contact hole 142b. The power line 148 is parallel to the gate line 145 and connected to the power electrode 134 through the power contact hole 154.

A second passivation layer 150 of an inorganic insulating material is formed on the gate line 145, the gate auxiliary pattern 146 and the power line 148. The second passivation layer 150 is patterned to form the auxiliary pattern contact hole 153 exposing the gate auxiliary pattern 146. The second passivation layer 150 and the first passivation layer 140 are patterned to form the first and second drain contact holes 152a and 152b respectively exposing the first and second drain electrodes 136a and 136b.

The pixel electrode 170 and the connection electrode 172 are formed on the second passivation layer 150. Each of the pixel electrode 170 and the connection electrode 172 is formed of a transparent conductive material. The pixel electrode 170 contacts and is connected to the second drain electrode 136b through the second drain contact hole 152b. On end of the connection electrode 172 contacts the first drain electrode 136a through the first drain contact hole 152a, and the other end of the connection electrode 172 contacts the gate auxiliary pattern 146 through the auxiliary pattern contact hole 153.

Since each of the first and second active layers 115a and 115b in the above array substrate is formed of intrinsic polycrystalline silicon, mobility of carriers in a channel of the active layers 115a and 115b is improved with compared to the related art array substrate. In addition, since each of the first and second gate electrodes 105a and 105b is formed of impurity-doped polycrystalline silicon, not a metallic material, a deformation problem on the metallic gate electrode under a high temperature during a crystallization process for the first and second active layers 115a and 115b is prevented.

Furthermore, a first portion of the interlayer insulating layer 122 between the first and second active contact holes 123a and 123b covers a center of the first active layer 115a to serve as a first etch-stopper. A second portion of the interlayer insulating layer 122 between the third and fourth active contact holes 123c and 123d covers a center of the second active layer 115b to serve as a second etch-stopper. Namely, portions of the interlayer insulating layer 122 serve as an etch-stopper for the first and second active layers 115a and 115b, there is no thickness difference in each of the first and second active layers 115a and 115b. As a result, a degradation problem of the property in the TFT is prevented.

Unfortunately, since the above array substrate requires ten contact holes in one pixel region, there is a problem in an aperture ratio.

Figure 7:
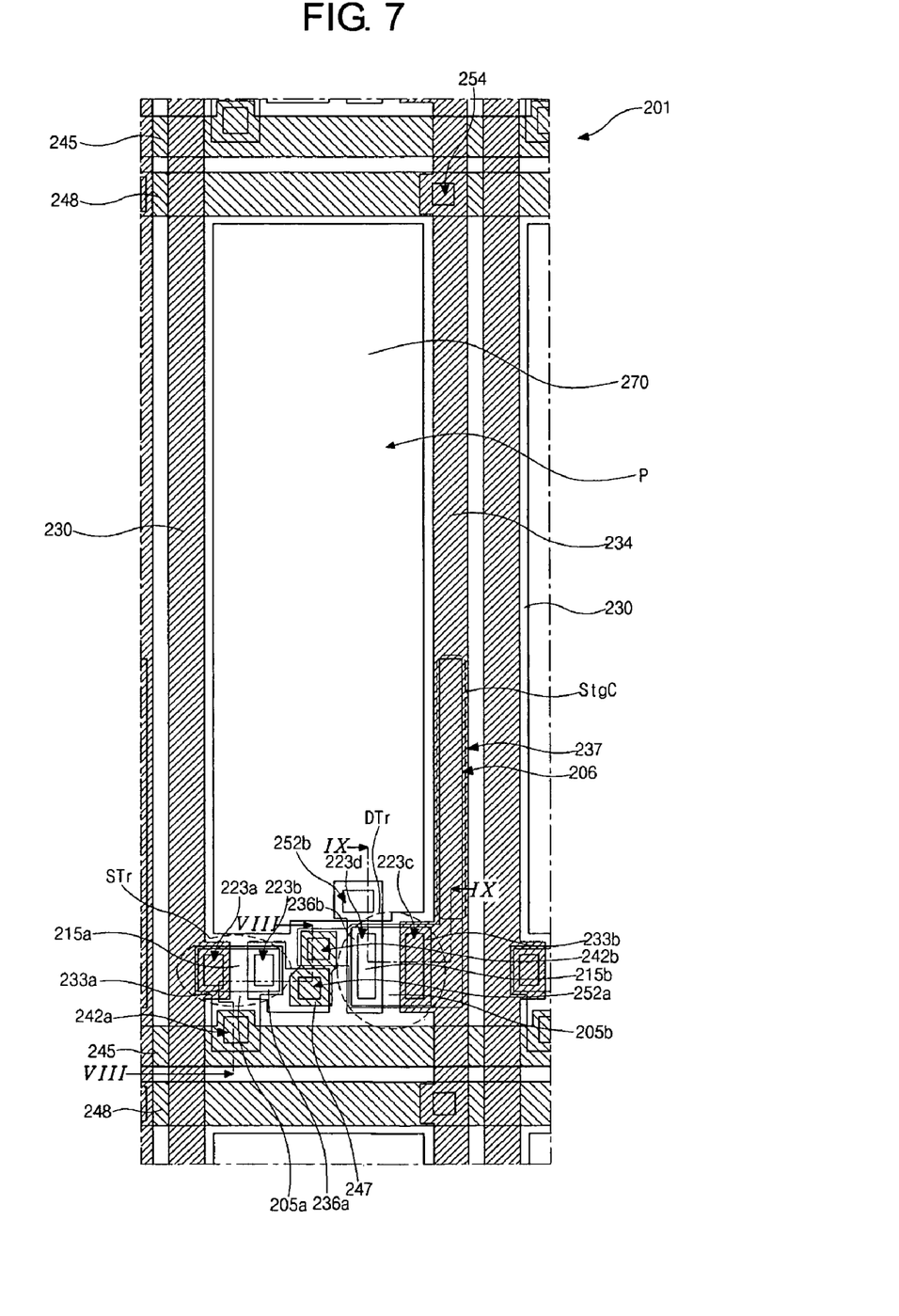
FIG. 7 is a plan view of one pixel region of an array substrate for an OELD device according to a second embodiment of the present invention.

FIG. 7 is a plan view of one pixel region of an array substrate for an OELD device according to a second embodiment of the present invention. The array substrate according to the second embodiment has an improved aperture ratio.

In FIG. 7, a gate line 245 and a data line 230 are formed on a substrate 201. The gate and data lines 245 and 230 cross each other to define a pixel region P. A power line 248 is formed to be spaced apart from and parallel to the gate line 245. A power electrode 234 connected to the power line 248 through a power contact hole 254 is formed to be spaced apart from and parallel to the data line 230.

In the pixel region P, a switching TFT Str, which is connected to the gate and data lines 245 and 230, and a driving TFT DTr, which is connected to the switching TFT STr, are formed. A first gate electrode 205a of the switching TFT STr is connected to the gate line 245 through a first gate contact hole 242a, a first source electrode 233a of the switching TFT STr extends from the data line 230. A first drain electrode 236a of the switching TFT STr and a second gate electrode 205b of the driving TFT DTr are connected to each other via a connection electrode 247. Namely, one end of the connection electrode 247 contacts the first drain electrode 236a through a first drain contact hole 252a, and the other end of the connection electrode 247 contacts the second gate electrode 205b through a second gate contact hole 242b. As a result, the first drain electrode 236a is electrically connected to the second gate electrode 205b.

A pixel electrode 270, which is connected to a second drain electrode 236b of the driving TFT DTr through a second drain contact hole 252b, is formed in the pixel region P. A second source electrode 233b of the driving TFT DTr extends from the power electrode 234. In addition, a portion of the power electrode 234 overlaps a portion of the second gate electrode 2105b with a gate insulating layer (not shown) and an interlayer insulating layer (not shown) interposed therebetween. The overlapped portion of the second gate electrode 205b serves as a first storage electrode 206, the overlapped portion of the power electrode 234 serves as a second storage electrode 237, and the gate insulating layer and the interlayer insulating layer serve as a dielectric material layer. The first storage electrode 206, the second storage electrode 237 and the dielectric material layer constitute a storage capacitor StgC.

The array substrate according to the first embodiment requires three contact hole for connecting the driving TFT DTr to the switching TFT STr, while the array substrate according to the second embodiment requires two contact hole for connecting the driving TFT DTr to the switching TFT STr. Namely, a number of the contact holes for connecting the driving TFT DTr to the switching TFT STr is reduced in the array substrate according to the second embodiment such that an aperture ratio is improved.

Figure 8:
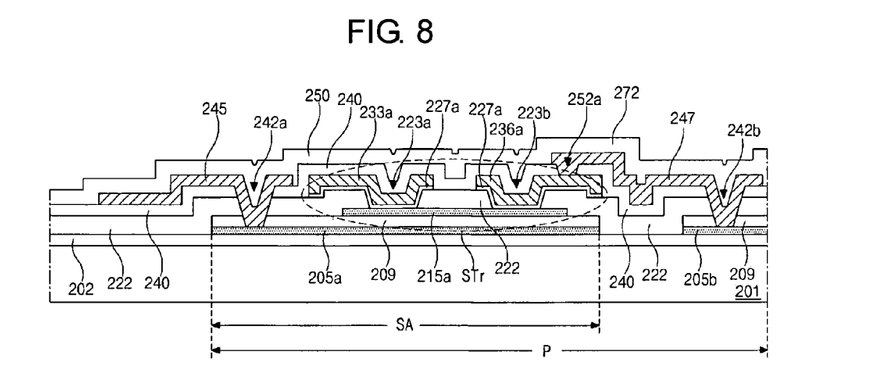
FIG. 8 is a cross-sectional view taken along the line VIII-VIII of FIG. 7.
Figure 9:
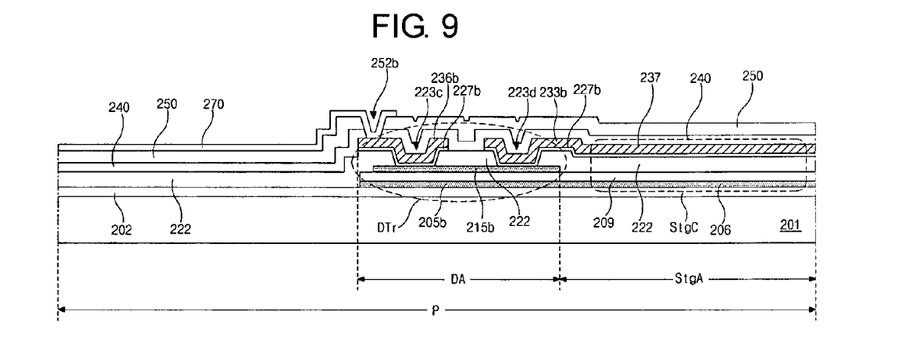
FIG. 9 is a cross-sectional view taken along the line IX-IX of FIG. 7.

Referring to FIG. 8, which is a cross-sectional view taken along the line of FIG. 7, and FIG. 9, which is a cross-sectional view taken along the line IX-IX of FIG. 7, with FIG. 7, the array substrate is explained in more detail. For convenience for explanation, a switching region SA, where the switching TFT STr is formed, a driving region DA, where the driving TFT DTr is formed, and a storage region StgA, where the storage capacitor StgC is formed, are defined in the pixel region P.

A buffer layer 202, which is made of an inorganic insulating material, is formed on the substrate 201. The first gate electrode 205a and the second gate electrode 205b are respectively formed on the buffer layer 202 and in the switching and driving regions SA and DA. Each of the first and second gate electrodes 205a and 205b is formed of impurity-doped polycrystalline silicon. The second gate electrode 205b extends into the storage region StgA such that the first storage electrode 206 is formed in the storage region StgA.

The gate insulating layer 209 is formed to cover the first and second gate electrodes 2105a and 205b and the first storage electrode 206. The gate insulating layer 209 is formed of an inorganic insulating material. The first and second active layers 215a and 215b are formed on the gate insulating layer 209 and respectively disposed in the switching and driving regions SA and DA. Each of the first and second active layers 215a and 215b is formed of intrinsic polycrystalline silicon. The first and second active layers 215a and 215b respectively correspond to the first and second gate electrodes 205a and 205b. The first and second active layers 215a and 215b respectively has a plan area smaller than the first and second gate electrodes 205a and 205b. The first and second gate electrodes 205a and 205b perfectly shield the first and second active layers 215a and 215b from beneath, respectively. At least one side portion of the gate insulating layer 209 is exposed by each of the first and second actively layers 215a and 215b. Namely, the at least one side portion of the gate insulating layer 109 2s not covered with the first and second active layers 215a and 215b.

The interlayer insulating layer 222 including the first to fourth active contact holes 223a to 223d is formed on the first and second active layers 215a and 215b. The first and second active contact holes 2123a and 223b respectively expose both sides of the first active layer 215a, and the third and fourth active contact holes 223c and 223d respectively expose both sides of the second active layer 215b. A center of each of the first and second active layers 215a and 215b is covered with portions of the interlayer insulating layer 222. Namely, the portions of the interlayer insulating layer 222 serves as an etch-stopper.

On the interlayer insulating layer 222, first ohmic contact layers 127a contacting the first active layer 215a through the first and second active contact holes 223a and 223b is formed in the switching region SA. The first source electrode 233a is formed on one of the first ohmic contact layers 227a, and the first drain electrode 236a is formed on the other one of the first ohmic contact layers 227a. The one of the first ohmic contact layers 227a and the first source electrode 233a are spaced apart from the other one of the first ohmic contact layers 227a and the first drain electrode 236a, respectively.

On the interlayer insulating layer 222, second ohmic contact layers 227b contacting the second active layer 215b through the third and fourth active contact holes 223c and 223d is formed in the driving region DA. The second source electrode 233b is formed on one of the second ohmic contact layers 227b, and the second drain electrode 236b is formed on the other one of the second ohmic contact layers 227b. The one of the second ohmic contact layers 227b and the second source electrode 233b are spaced apart from the other one of the second ohmic contact layers 227b and the second drain electrode 236b, respectively. The second source electrode 233b extends into the storage region StgA such that the second storage electrode 237 is formed in the storage region StgA. The second source electrode 233b further extends to form the power electrode 234 (of FIG. 7).

In addition, the data line 230 (of FIG. 7) is formed on the interlayer insulating layer 222 and connected to the first source electrode 233a. The data line 230a is parallel to and spaced apart from the power electrode 234 (of FIG. 7).

A first passivation layer 240 of an inorganic insulating material is formed on the first and second source electrodes 233a and 233b, the first and second drain electrodes 236a and 236b, the second storage electrode 237, the power electrode 234 and the data line 230. The first passivation layer 240 is patterned to form a first drain contact hole 252a exposing the first drain electrode 236a of the switching TFT STr. The first passivation layer 240, the interlayer insulating layer 222 and the gate insulating layer 209 are patterned to form the first and second gate contact holes 242a and 242b respectively exposing the first and second gate electrodes 205a and 205b. In addition, the first passivation layer 240 is patterned to form the power contact hole 254 (of FIG. 7) exposing the power electrode 234.

The gate line 245, the connection electrode 247 and the power line 248 (of FIG. 7) are formed on the first passivation layer 240. The gate line 245 is connected to the first gate electrode 205a through the first gate contact hole 242a and cross the data line 230 to define the pixel region P. The second gate electrode 205b and the first drain electrode 236a are electrically connected to each other by the connection electrode 247. One end of the connection electrode 247 contacts the first drain electrode 236a through the first drain contact hole 252a, and the other end of the connection electrode 247 contacts the second gate electrode 205b through the second gate contact hole 242b. The power line 248 is parallel to the gate line 145 and connected to the power electrode 234 through the power contact hole 254.

In the above array substrate according to the second embodiment, the first drain electrode 236a of the switching TFT STr and the second gate electrode 205b of the driving TFT DTr are electrically connected to each other by the connection electrode 247 without the gate auxiliary pattern 146 (of FIG. 5) such that the array substrate according to the second embodiment requires less contacts hole than the array substrate according to the first embodiment. As a result, an aperture ratio is increased as much as an area of one contact hole.

A second passivation layer 250 of an inorganic insulating material is formed on the gate line 245, the connection electrode 247 and the power line 248. The second passivation layer 250 and the first passivation layer 240 are patterned to form the second drain contact hole 252b exposing the second drain electrode 236b.

The pixel electrode 270 is formed on the second passivation layer 250. The pixel electrode 270 is formed of a transparent conductive material. The pixel electrode 270 contacts and is connected to the second drain electrode 236b through the second drain contact hole 252b.

Although not shown, a bank is formed on the pixel electrode 270 and at boundaries of the pixel region P. Namely, the bank covers edges of the pixel electrode 270 and has an opening corresponding to a center of the pixel electrode 270. An organic emitting layer is formed on the pixel electrode 270 and in the pixel region P. Namely, the organic emitting layer is positioned in the opening of the bank. The pixel electrode 270 serves as a first electrode for an organic electroluminescent diode. A second electrode covering an entire of the substrate 201 is formed on the organic emitting layer. The second electrode serves as a counter electrode for the pixel electrode 270. The pixel electrode 270 as the first electrode, the organic emitting layer and the second electrode constitute an organic electroluminescent diode of the array substrate for an OELD device.

Since each of the first and second active layers 215a and 215b in the above array substrate is formed of intrinsic polycrystalline silicon, mobility of carriers in a channel of the active layers 215a and 215b is improved with compared to the related art array substrate. In addition, since each of the first and second gate electrodes 205a and 205b is formed of impurity-doped polycrystalline silicon, not a metallic material, a deformation problem on the metallic gate electrode under a high temperature during a crystallization process for the first and second active layers 215a and 215b is prevented.

Furthermore, portions of the interlayer insulating layer 222 serve as an etch-stopper for the first and second active layers 215a and 215b, there is no thickness difference in each of the first and second active layers 215a and 215b. As a result, a degradation problem of the property in the TFT is prevented.

Moreover, since the second gate electrode 205b of the driving TFT DTr is electrically connected to the first drain electrode 236a of the switching TFT STr by the connection electrode 247, ends of the which respectively contacts the first drain electrode 236a through the first drain contact hole 252a and the second gate electrode 205b through the second gate contact hole 242b, a number of the contact holes is reduced. As a result, the array substrate has an improved aperture ratio.

A method of fabricating the array substrate according to the present invention is explained with reference to FIGS. 7 to 9.

The buffer layer 202 is formed on an entire surface of the substrate 201 of a transparent insulating material by depositing an inorganic insulating material, for example, silicon oxide or silicon nitride. A solid phase crystallization (SPC) process is required in the present invention for crystallizing an amorphous silicon into a polycrystalline silicon layer. The SPC process is performed under a temperature of about 600 to 800° C. When the substrate 201 is exposed to the process temperature of the SPC process without the buffer layer 202, an alkali ion is diffused from the substrate 201 to the polycrystalline silicon layer such that properties of the polycrystalline silicon layer is degraded. To prevent this problem, the buffer layer 202 is required.

Next, a first impurity-doped amorphous silicon layer (not shown), a first inorganic insulating layer (not shown) and an intrinsic amorphous silicon layer (not shown) are formed on the buffer layer 202 by sequentially depositing impurity-doped amorphous silicon, an inorganic insulating material, for example, silicon oxide or silicon nitride, and intrinsic amorphous silicon.

In the related art array substrate, the active layer of intrinsic amorphous silicon should have a thickness above 1000 angstroms because the active layer is partially removed by the dry-etching process for the ohmic contact layer. However, since the intrinsic amorphous silicon layer is not exposed to a dry-etching process due to the interlayer insulating layer as an etch-stopper, the intrinsic amorphous silicon layer has a thickness being capable of serving as an active layer. Namely, the intrinsic amorphous silicon layer has a relatively low thickness of about 300 to 1000 angstroms such that production costs and a fabricating time are reduced.

Next, to improve a mobility property of the intrinsic amorphous silicon layer, the SPC process is performed. The intrinsic amorphous silicon layer is crystallized by the SPC process to form an intrinsic polycrystalline silicon layer (not shown). For example, the SPC process is a thermal crystallization process or an alternating magnetic field crystallization process. In the thermal crystallization process, the intrinsic amorphous silicon layer is heated under a temperature of about 600 to 800° C. In the alternating magnetic field crystallization process, the intrinsic amorphous silicon layer is crystallized using alternating magnetic field crystallization apparatus under a temperature of about 600 to 700° C.

Next, the intrinsic polycrystalline silicon layer and the first inorganic insulating layer, the first metal layer 106 (of FIG. 6) and the impurity-doped polycrystalline silicon layer under the intrinsic polycrystalline silicon layer are sequentially patterned to form the first gate electrode 205a, the gate insulating layer 209 and a first intrinsic polycrystalline silicon pattern (not shown) on the buffer layer 202 and in the switching region SA. The first gate electrode 205a, the gate insulating layer 209 and the first intrinsic polycrystalline silicon pattern in the switching region SA has substantially the same plane area as one another to perfectly overlap. At the same time, the second gate electrode 205b, the gate insulating layer 209 and a second intrinsic polycrystalline silicon pattern (not shown) are formed on the buffer layer 202 and in the driving region DA. The second gate electrode 205b, the gate insulating layer 209 and the second intrinsic polycrystalline silicon pattern in the driving region DA has substantially the same plane area as one another to perfectly overlap. The second gate electrode 205b extends into the storage region StgA to form the first storage electrode 206.

In the present invention, each of the first and second gate electrodes 205a and 205b is formed of impurity-doped polycrystalline silicon to resolve below problem. In a fabricating process of the bottom gate type TFT, the gate line and the gate electrode are formed on the substrate by depositing and patterning a metallic material having a low resistant property, and the semiconductor layer of amorphous silicon is formed over the gate electrode with the gate insulating layer therebetween. To crystallize the semiconductor layer, the SPC process is performed under a relatively high temperature, for example, above 600° C. During the SPC process, the gate electrode and the gate line of the metallic material are deformed. Or, the gate electrode protrudes through the gate insulating layer because of a thermal effect during the SPC process such that the gate electrode contacts the intrinsic polycrystalline silicon layer. It may be referred to as a spike problem. However, since each of the first and second gate electrodes 205a and 205b is formed of impurity-doped polycrystalline silicon in the present invention, there is no problem.

Next, the first and second active layers 215a and 215b are respectively formed in the switching and driving regions SA and DA by patterning the first and second intrinsic polycrystalline patterns. The second intrinsic polycrystalline silicon pattern in the storage region StgA is removed.

Next, the interlayer insulating layer 222 is formed on the first and second active layers 215a and 215b by depositing an inorganic insulating layer, for example, silicon oxide or silicon nitride. The interlayer insulating layer 222 is patterned to form the first to fourth active contact holes 223a to 223d. The first and second active contact holes 223a and 223b respectively expose both sides of the first active layer 215a, and the third and fourth active contact holes 223c and 223d respectively expose both sides of the second active layer 215b. A portion of the interlayer insulating layer 222 corresponding to a center of the first active layer 215a serves as an etch-stopper for the first active layer 215a, and a portion of the interlayer insulating layer 222 corresponding to a center of the second active layer 215b serves as an etch-stopper for the second active layer 215b.

Next, a second impurity-doped amorphous silicon layer (not shown) and a first metal layer are formed on the interlayer insulating layer 222 by respectively depositing impurity-doped amorphous silicon and a first metallic material. The first metallic material includes one of molybdenum (Mo), chromium (Cr) and Mo-titanium alloy (MoTi).

The first metal layer and the second impurity-doped amorphous silicon layer are patterned to form the data line 230, the first ohmic contact layers 227a, the first source electrode 233a, the first drain electrode 236a, the second ohmic contact layers 227b, the second source electrode 233b and the second drain electrode 236b. The first ohmic contact layers 227a, the first source electrode 233a and the first drain electrode 236a are positioned in the switching region SA. The first ohmic contact layers 227a contact the first active layer 215a through the first and second active contact holes 223a and 223b. The first source electrode 233a is formed on one of the first ohmic contact layers 227a, and the first drain electrode 236a is formed on the other one of the first ohmic contact layers 227a. The one of the first ohmic contact layers 227a and the first source electrode 233a are spaced apart from the other one of the first ohmic contact layers 227a and the first drain electrode 236a, respectively. The second ohmic contact layers 227b, the second source electrode 233b and the second drain electrode 236b are positioned in the driving region DA. The second ohmic contact layers 227b contact the second active layer 215b through the third and fourth active contact holes 223c and 223d. The second source electrode 233b is formed on one of the second ohmic contact layers 227b, and the second drain electrode 236b is formed on the other one of the second ohmic contact layers 227b. The one of the second ohmic contact layers 227b and the second source electrode 233b are spaced apart from the other one of the second ohmic contact layers 227b and the second drain electrode 236b, respectively. The second source electrode 233b extends into the storage region StgA such that the second storage electrode 237 is formed in the storage region StgA. The second source electrode 233b further extends to form the power electrode 234 being parallel to the data line 230. A dummy pattern of the same material as the first and second ohmic contact layers 227a and 227b may be formed under each of the data line 230 and the power electrode 234.

Although not shown, before the second impurity-doped amorphous silicon layer is formed, a barrier layer (not shown) may be formed on the interlayer insulating layer 222 by depositing intrinsic amorphous silicon. When the barrier layer is formed, the barrier layer is patterned with the first metal layer and the second impurity-doped amorphous silicon layer such that barrier patterns (not shown) are disposed under each of the first and second ohmic contact patterns 227a and 227b. The barrier patterns have substantially the same shape as each of the first and second ohmic contact patterns 227a and 227b and contacts the first and second active layers 215a and 215b through the first to fourth contact holes 223a to 223d of the interlayer insulating layer 222. Contact strength between intrinsic amorphous silicon and intrinsic polycrystalline silicon is larger than that between impurity-doped amorphous silicon and intrinsic polycrystalline silicon. Accordingly, the barrier layer of intrinsic amorphous silicon is positioned between the first and second active layers 215a and 215b and the second impurity-doped amorphous silicon layer to improve contact strength between each of the first and second active layers 215a and 215b of intrinsic polycrystalline silicon and the impurity-doped amorphous silicon layer. The barrier layer is not essential.

Although not shown, before forming the second impurity-doped amorphous silicon layer or the barrier layer on the interlayer insulating layer 222, a cleaning process using a buffered oxide etchant (BOE) may be performed. It may be called as a BOE cleaning process. The intrinsic amorphous silicon layer is directly exposed to the SPC process under a high temperature of 600 to 800° C. to form the first and second active layers 215a and 215b. As a result, a thermal oxidation layer (not shown) is formed on a top surface of the first and second active layers 215a and 215b. An ohmic contact property between each of the first and second active layers 215a and 215b and each of the first and second ohmic contact layers 227a and 227b or between each of the first and second active layers 215a and 215b and each of the barrier patterns is degraded by the thermal oxidation layer. Accordingly, the BOE cleaning process can be performed onto the first and second active layers 215a and 215b to remove the thermal oxidation layer before the step of forming the second impurity-doped amorphous silicon layer or the barrier layer.

In the present invention, since a portion of the interlayer insulating layer 222 as the etch-stopper covers the center portion of each of the first and second active layers 215a and 215b, there is no damage on the first and second active layers 215a and 215b during a dry-etching process for the first and second ohmic contact layers 227a and 227b. Namely, since the interlayer insulating layer 222 covers the center portion of each of the first and second active layers 215a and 215b during the dry-etching process for the first and second ohmic contact layers 227a and 227b, the interlayer insulating layer 222 protects the first and second active layers 215a and 215b such that a thickness of each of the first and second active layers 215a and 215b is not reduced by the dry-etching process. Accordingly, each of the first and second active layers 215a and 215b has an uniform thickness.

The first gate electrode 205a of impurity-doped polycrystalline silicon, the gate insulating layer 209, the first active layer 215a of intrinsic polycrystalline silicon, the interlayer insulating layer 222, the first ohmic contact layers 227a of impurity-doped amorphous silicon, the first source electrode 233a and the first drain electrode 236a constitute the switching TFT STr in the switching region SA. The second gate electrode 205b of impurity-doped polycrystalline silicon, the gate insulating layer 209, the second active layer 215b of intrinsic polycrystalline silicon, the interlayer insulating layer 222, the second ohmic contact layers 227b of impurity-doped amorphous silicon, the second source electrode 233b and the second drain electrode 236b constitute the driving TFT DTr in the driving region DA. The first storage electrode 206, the gate insulating layer 209, the interlayer insulating layer 222 and the second storage electrode 237 constitute the storage capacitor StgC in the storage region StgA.

Next, the first passivation layer 240 is formed on the first and second source electrodes 233a and 233b, the first and second drain electrodes 236a and 236b, the second storage electrode 237, the power electrode 234 and the data line 230 by depositing an inorganic insulating material, for example, silicon oxide or silicon nitride. The first passivation layer 240, the interlayer insulating layer 222 and the gate insulating layer 209 are patterned by a mask process to form the first and second gate contact holes 242a and 242b respectively exposing one side of the first and second gate electrodes 205a and 205b. At the same time, the first drain contact hole 252a exposing the first drain electrode 236a of the switching TFT STr and the power contact hole 254 exposing the power electrode 234 are formed.

Next, a second metal layer (not shown) is formed on the first passivation layer 240 including the first and second gate contact holes 242a and 242b, the first drain contact hole 252a and the power contact hole 254 by depositing a second metallic material, for example, aluminum (Al), Al alloy, copper (Cu), Cu alloy, molybdenum (Mo) or chromium (Cr). The second metal layer is patterned to form the gate line 245, the connection electrode 247 and the power line 248. The gate line 245 is connected to the first gate electrode 205a through the first gate contact hole 242a and cross the data line 230 to define the pixel region P. The second gate electrode 205b and the first drain electrode 236a are electrically connected to each other by the connection electrode 247. One end of the connection electrode 247 contacts the first drain electrode 236a through the first drain contact hole 252a, and the other end of the connection electrode 247 contacts the second gate electrode 205b through the second gate contact hole 242b. The power line 248 is parallel to the gate line 245 and connected to the power electrode 234 through the power contact hole 254.

Next, the second passivation layer 250 is formed on the gate line 245, the connection patter 247 and the power line 248 by depositing an inorganic insulating material, for example, silicon oxide or silicon nitride. The second passivation layer 250 and the first passivation layer 240 are patterned to form the second drain contact hole 252b exposing the second drain electrode 236b.

A transparent conductive material layer (not shown) is formed on the second passivation layer 250 including the second drain contact hole 252b by depositing a transparent conductive material, for example, indium-tin-oxide (ITO) or indium-zinc-oxide (IZO). The transparent conductive material layer is patterned to form the pixel electrode 270.

The pixel electrode 270 contacts and is connected to the second drain electrode 236b through the second drain contact hole 252b.

Although not shown, a bank is formed on the pixel electrode 270 and at boundaries of the pixel region P. Namely, the bank covers edges of the pixel electrode 270 and has an opening corresponding to a center of the pixel electrode 270. An organic emitting layer is formed on the pixel electrode 270 as the first electrode and in the pixel region P. A second electrode covering an entire of the substrate 201 is formed on the organic emitting layer. The pixel electrode 270 as the first electrode, the organic emitting layer and the second electrode constitute an organic electroluminescent diode of the array substrate for an OELD device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate, comprising:
   a substrate including a switching region and a driving region;
   first and second gate electrodes positioned on the substrate and in the switching region and the driving region, respectively;
   a gate insulating layer on the first and second gate electrodes and including a first gate contact hole exposing a portion of the first gate electrode and a second gate contact hole exposing a portion of the second gate electrode;
   first and second active layers on the gate insulating layer and corresponding to the first and second gate electrodes, respectively;
   an interlayer insulating layer on the first and second active layers, the interlayer insulating layer including first to fourth active contact holes and the first and second gate contact holes, the first and second active contact holes respectively exposing both sides of the first active layer, the third and fourth active contact holes respectively exposing both sides of the second active layer;
   first and second ohmic contact layers respectively contacting both sides of the first active layer through the first and second active contact holes;
   third and fourth ohmic contact layers respectively contacting both sides of the second active layer through the third and fourth active contact holes;
   first source electrode and first drain electrode respectively on the first and second ohmic contact layers;
   second source electrode and second drain electrode respectively on the third and fourth ohmic contact layers;
   a data line on the interlayer insulating layer and connected to the first source electrode;
   a first passivation layer on the data line, the first and second source electrodes and the first and second drain electrodes and including the first and second gate contact holes, a first drain contact hole exposing a portion of the first drain electrode and a second drain contact hole exposing a portion of the second drain electrode;
   a gate line on the first passivation layer and connected to the first gate electrode through the first gate contact hole, the gate line crossing the data line;
   a power line on the first passivation layer and parallel to and spaced apart from the gate line;
   a connection electrode on the first passivation layer, one end of the connection electrode connected to the first drain electrode through the first drain contact hole, the other end of the connection electrode connected to the second gate electrode through the second gate contact hole;
   a second passivation layer on the gate line, the power line and the connection electrode and including the second drain contact hole; and
   a pixel electrode on the second passivation layer and connected to the second drain electrode through the second drain contact hole.

2. The substrate according to claim 1, further comprising a buffer layer positioned on the substrate and under the first and second gate electrodes and formed of an inorganic insulating material.

3. The substrate according to claim 1, further comprising:
   a first storage electrode extending from the second gate electrode; and
   a second storage electrode extending from the second source electrode,
   wherein the first storage electrode, the gate insulating layer on the first storage electrode, the interlayer insulating layer on the gate insulating layer and the second storage electrode on the interlayer insulating layer constitute a storage capacitor.

4. The substrate according to claim 3, further comprising a power electrode extending from the second source electrode and parallel to the data line, wherein the power line is connected to the power electrode through a power contact hole in the first passivation layer.

5. The substrate according to claim 1, further comprising:
a bank covering edges of the pixel electrode and having an opening exposing a center of the pixel electrode;
an organic emitting layer on the pixel electrode and in the opening; and
a counter electrode on the organic emitting layer.

6. The substrate according to claim 1, wherein each of the first to fourth ohmic contact layers is formed of impurity-doped amorphous silicon.

7. The substrate according to claim 1, wherein each of the first and second gate electrodes is formed of impurity-doped polycrystalline silicon.

8. The substrate according to claim 1, wherein each of the first and second active layers is formed of intrinsic polycrystalline silicon.

9. A method of fabricating an array substrate, comprising:
forming first and second gate electrodes on a substrate including a switching region and a driving region, a gate insulating layer on the first and second gate electrodes, and first and second active layers on the gate insulating layer and corresponding to the first and second gate electrodes, respectively, the first and second gate electrodes respectively positioned in the switching and driving regions;
forming an interlayer insulating layer on the first and second active layers and including first to fourth active contact holes, the first and second active contact holes respectively exposing both sides of the first active layer, the third and fourth active contact holes respectively exposing both sides of the second active layer;
forming first to fourth ohmic contact layers, first and second source electrodes, first and second drain electrodes and a data line on the interlayer insulating layer, the first and second ohmic contact layers respectively contacting both sides of the first active layer through the first and second active contact holes, the third and fourth ohmic contact layers respectively contacting both sides of the second active layer through the third and fourth active contact holes, the first source electrode and the first drain electrode respectively on the first and second ohmic contact layers, the second source electrode and the second drain electrode respectively on the third and fourth ohmic contact layers, the data line connected to the first source electrode;
forming a first passivation layer on the data line, the first and second source electrodes and the first and second drain electrodes and including first and second gate contact holes respectively exposing the first and second gate electrodes and a first drain contact hole exposing the first drain electrode;
forming a gate line, a power line and a connection electrode on the first passivation layer, the gate line connected to the first gate electrode through the first gate contact hole and crossing the data line, the power line parallel to and spaced apart from the gate line, one end of the connection electrode connected to the first drain electrode through the first drain contact hole, the other end of the connection electrode connected to the second gate electrode through the second gate contact hole;
forming a second passivation layer on the gate line, the power line and the connection electrode and including a second drain contact hole exposing the second drain electrode; and
forming a pixel electrode on the second passivation layer and connected to the second drain electrode through the second drain contact hole.

10. The method according to claim 9, further comprising forming a buffer layer of an inorganic insulating material on the substrate before the step of forming the first and second gate electrodes.

11. The method according to claim 9, wherein the step of forming the first and second gate electrodes, the gate insulating layer, the first and second active layers includes:
sequentially forming a first impurity-doped amorphous silicon layer, a first inorganic insulating layer and an intrinsic amorphous silicon layer;
performing a solid phase crystallization process to crystallize the intrinsic amorphous silicon layer into an intrinsic polycrystalline silicon layer and the first impurity-doped amorphous silicon layer into an impurity-doped polycrystalline silicon layer;
pattering the polycrystalline silicon layer, the first inorganic insulating layer and the impurity-doped polycrystalline silicon layer to form the first and second gate electrodes, the gate insulating layer and first and second intrinsic polycrystalline silicon patterns; and
patterning the first and second intrinsic polycrystalline silicon patterns to form the first and second active layers.

12. The method according to claim 9, wherein the solid phase crystallization process is one of a thermal crystallization process or an alternating magnetic field crystallization process.

13. The method according to claim 9, wherein the step of forming the first to fourth ohmic contact layers, the first and second source electrodes, the first and second drain electrodes and the data line on the interlayer insulating layer includes:
sequentially forming an impurity-doped amorphous silicon layer and a metal layer on the interlayer insulating layer; and
patterning the metal layer and the impurity-doped amorphous silicon layer to form the first to fourth ohmic contact layers, the first and second source electrodes, the first and second drain electrodes and the data line.

14. The method according to claim 13, further comprising performing a cleaning process onto the exposed sides of the first and second active layers using a buffered oxide etchant before the step of sequentially forming the impurity-doped amorphous silicon layer and the metal layer.

15. The method according to claim 9, wherein the step of forming the first and second gate electrodes includes forming a first storage electrode extending from the second gate electrode, and the step of forming the first to fourth ohmic contact layers, the first and second source electrodes, the first and second drain electrodes and the data line on the interlayer insulating layer includes forming a second storage electrode extending from the second source electrode, and wherein the first storage electrode, the gate insulating layer on the first storage electrode, the interlayer insulating layer on the gate insulating layer and the second storage electrode on the interlayer insulating layer constitute a storage capacitor.

16. The method according to claim 15, wherein the step of forming the first to fourth ohmic contact layers, the first and second source electrodes, the first and second drain electrodes and the data line on the interlayer insulating layer further includes forming a power electrode extending from the second source electrode, and the power line is connected to the power electrode through a power contact hole in the first passivation layer.

17. The method according to claim 9, further comprising:
forming a bank covering edges of the pixel electrode and having an opening exposing a center of the pixel electrode;
forming an organic emitting layer on the pixel electrode and in the opening; and
forming a counter electrode on the organic emitting layer.

* * * * *